(12) United States Patent
Jansson et al.

(10) Patent No.: US 9,877,042 B1
(45) Date of Patent: Jan. 23, 2018

(54) POSITION ENCODER SAMPLE TIMING SYSTEM

(71) Applicant: Mitutoyo Corporation, Kanagawa-ken (JP)

(72) Inventors: Bjorn Erik Bertil Jansson, Snohomish, WA (US); Andrew Michael Patzwald, Kirkland, WA (US)

(73) Assignee: Mitutoyo Corporation, Kanagawa-ken (JP)

( * ) Notice: Subject to any disclaimer, the term of this patent is extended or adjusted under 35 U.S.C. 154(b) by 0 days.

(21) Appl. No.: 15/606,449

(22) Filed: May 26, 2017

(51) Int. Cl.
H03M 1/22 (2006.01)
H04N 19/52 (2014.01)
G01D 5/22 (2006.01)

(52) U.S. Cl.
CPC ........... *H04N 19/52* (2014.11); *G01D 5/2266* (2013.01); *G01D 5/2291* (2013.01); *H03M 1/22* (2013.01)

(58) Field of Classification Search
CPC ........ H03M 1/22; H03M 1/285; H03M 1/305; H03M 1/504; G01D 5/2451; G01D 5/2497; G01D 5/2455; G01D 5/2457; G01D 3/08; G01D 5/24447; G01D 5/34792; G01D 5/147; G01D 5/244; G01D 5/24461; G01D 5/24476; G01D 5/24495; G01D 5/2492; G01D 5/2495
USPC ...... 341/5, 6, 7, 35, 116; 250/231.13, 201.2, 250/231.14, 231.16
See application file for complete search history.

(56) References Cited

U.S. PATENT DOCUMENTS

| | | | | |
|---|---|---|---|---|
| 5,612,602 A | * | 3/1997 | Kubota | G05B 19/237 318/560 |
| 5,689,384 A | * | 11/1997 | Albrecht | G11B 5/584 360/77.12 |
| 5,721,546 A | * | 2/1998 | Tsutsumishita | G01D 5/24409 341/116 |
| 5,923,272 A | * | 7/1999 | Albrecht | G11B 5/5508 341/55 |
| 6,005,387 A | | 12/1999 | Andermo et al. | |
| 6,011,389 A | | 1/2000 | Masreliez et al. | |
| 6,188,341 B1 | * | 2/2001 | Taniguchi | G01D 5/24409 341/111 |
| 6,452,739 B1 | * | 9/2002 | Hino | G11B 21/106 360/75 |
| 6,639,529 B1 | | 10/2003 | Jansson | |
| 7,608,813 B1 | | 10/2009 | Milvich et al. | |
| 8,309,906 B2 | | 11/2012 | Kapner et al. | |

(Continued)

*Primary Examiner* — Linh Nguyen
(74) *Attorney, Agent, or Firm* — Seed IP Law Group LLP

(57) ABSTRACT

A position encoder system (e.g., including a linear encoder) is configured to rapidly provide encoder position data in response to position trigger signals that are received from a host motion control system at predictable times (e.g., according to a preset frequency, etc.) A pre-trigger lead time is determined that is a fraction of a duration of a defined encoder position sample period. A current instance of the encoder position sample period is then initiated at the pre-trigger lead time before a next predictable time of the position trigger signal. A current position trigger signal is then received (e.g., near the middle of the current instance of the encoder position sample period) from the host motion control system. The average effective sample time of the current instance of the encoder position sample period coincides with the actual timing of the current position trigger signal within an allowed tolerance window.

20 Claims, 6 Drawing Sheets

(56) References Cited

U.S. PATENT DOCUMENTS

| | | | | |
|---|---|---|---|---|
| 2007/0035417 A1* | 2/2007 | Kiriyama | ........... | G01D 5/24404 341/8 |
| 2012/0116725 A1* | 5/2012 | Klinkenbusch | ........ | G01R 29/10 702/189 |
| 2014/0299754 A1* | 10/2014 | Okada | .................... | G01B 11/14 250/231.1 |
| 2014/0367561 A1* | 12/2014 | Ito | .......................... | G01D 5/347 250/231.1 |

* cited by examiner

POSITION ENCODER SAMPLE TIMING SYSTEM

BACKGROUND

Technical Field

This disclosure relates generally to position encoders, and more particularly to systems and methods for determining the timing of position sampling in position encoders.

Description of the Related Art

Various position encoders for sensing linear, rotary or angular movement are currently available. These encoders are generally based on either inductive transducers, capacitive transducers, optical systems, or magnetic scales. In general, an encoder may comprise a transducer with a readhead and a scale. The readhead may comprise a transducer element and some transducer electronics. The transducer outputs signals which vary as a function of the position of the readhead relative to the scale along a measuring axis. The transducer electronics outputs the signals to a signal processor or processes the signals internally before outputting modified signals indicative of the position of the readhead relative to the scale. It is also common for an encoder system to include interface electronics separate from the readhead, and to interpolate or otherwise processes the transducer signals in the interface electronics before outputting modified signals indicative of the position of the readhead relative to the scale to an external host.

Some position encoder systems communicate with an external host using a request and response process. This process may include three steps: the external host sends a request for a position measurement (e.g., a position trigger signal); the encoder samples the output of the position transducer; and the encoder responds by transmitting position information. Two patents which are directed to timing issues (i.e., related to accounting for and/or calibrating sample delays) in such request and response systems are U.S. Pat. Nos. 5,721,546 and 6,639,529, which are hereby incorporated herein by reference in their entireties. While such prior art techniques are effective at calibrating and/or accounting for sampling delays, they do not address certain other timing issues with regard to the request and response process (e.g., the overall timing between the request and the response being too long for certain applications, etc.) A position encoder system that is able to provide improvements with regard to such issues would be desirable.

BRIEF SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

A position encoder system is provided including a position encoder that is configured to be utilized for outputting encoder position data corresponding to encoder positions and an encoder position timing subsystem. The position encoder system receives position trigger signals from a host motion control system. A method for operating the position encoder system initially determines predictable times when position trigger signals are expected to be received from the host motion control system. A pre-trigger lead time is determined that is a fraction of the duration of a defined encoder position sample period during which the position encoder performs operations to acquire encoder position data associated with a current encoder position (e.g., by sampling a position transducer of the position encoder).

The encoder position timing subsystem is operated to initiate a current instance of the encoder position sample period at the pre-trigger lead time before a next predictable time of the position trigger signal. An associated current instance of the encoder position data is determined as corresponding to the current instance of the encoder position sample period. A current position trigger signal is received from the host motion control system, wherein the average effective sample time of the current instance of the encoder position sample period coincides with the actual timing of the current position trigger signal within an allowed tolerance window. The position encoder is operated to output the current instance of the encoder position data at a time associated with the current position trigger signal, such that the host motion control system associates the current instance of the encoder position data with the current position trigger signal. It will be appreciated that such techniques reduce the overall timing between when the position trigger signal is received from the host motion control system and when the position encoder responds with position data.

DETAILED DESCRIPTION

Figure 1:
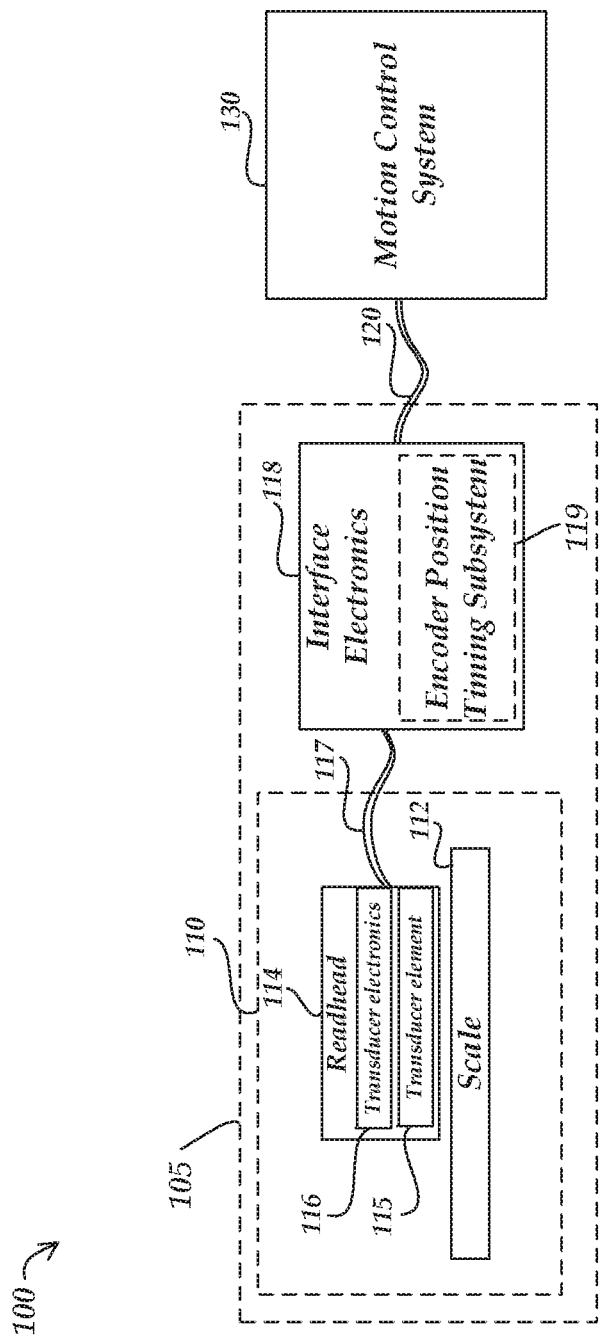
FIG. 1 is a block diagram of a position encoder system as coupled to a host motion control system.

FIG. 1 is a block diagram of a positioning system 100 including a position encoder system 105 that is coupled to a host motion control system 130. The position encoder system 105 includes a position encoder 110, which may be any type of encoder, such as a linear position encoder intended for use by servo controllers in applications such as pick-and-place machines, fluid dispensing machines, etc., and interface electronics 118. In the illustrated embodiment, the position encoder 110 includes a scale 112, a readhead 114, and a cable 117. In various implementations, an encoder position timing subsystem 119 may be included in the interface electronics 118. In certain alternative implementations, an encoder position timing subsystem 119 may be a separate component that is included within or outside of the position encoder system 105, as will be described in more detail below with respect to FIG. 2. The host motion control system 130 (e.g., in the form of a servo controller, etc.) communicates via a cable 120 with the position encoder system 105 to send position requests (e.g., position trigger signals) and to receive position information.

In operation, the host motion control system 130 sends commands (e.g., position trigger signals) over the cable 120 to the interface electronics 118. The interface electronics 118 may communicate via the cable 117 with the readhead 114. The interface electronics 118 trigger position acquisition operations in the readhead 114. As will be described in more detail below, in accordance with principles disclosed herein, the encoder position timing subsystem may provide a pre-trigger signal that triggers the position acquisition ahead of when the position trigger signal is received from the host motion control system. In response to the pre-trigger signal, the readhead 114 collects and/or provides signals that are dependent on the position of the scale 112 relative to a readhead transducer element 115, digitizes the signals using transducer electronics 116, and sends the signals via the cable 117 to the interface electronics 118. In one implementation, the interface electronics 118 may compute a position from the signals, and may send the position information to the host motion control system via the cable 120. In certain alternative implementations, all or part of the interface electronics 118 may be configured as a plug-in card and/or embedded software routines or the like, and included in the host motion control system 130, and in such cases the cable 120 may be eliminated.

It will be appreciated that in various implementations other types of connections between the transducer electronics 116 and the interface electronics 118 may be utilized. For example, the readhead 114 may receive power from a separate connection (not shown), and the transducer electronics 116 and the interface electronics 118 may be connected by any now known or later developed wireless communication methods. Also, in various implementations, the interface electronics 118 may be included in or adjacent to the readhead 114, and the cable 117 may be eliminated or replaced by any other appropriate type of connection.

In various implementations, the transducer that is utilized in the readhead 114 may be an inductive transducer. Various examples of some exemplary embodiments of inductive transducers are described in U.S. Pat. Nos. 6,011,389, and 6,005,387, which are commonly assigned and hereby incorporated herein by reference in their entireties. In various implementations, there may be various types of factors for such transducers (e.g., inductance and/or impedance of the transducer element, including transmitter and/or receiver coils, etc.) for which there may be a "transmitter setup" time (e.g., during which certain components take time to charge up as an initial part of a sampling process, etc.). In various implementations, different types of configurations for the scale 112 (e.g., linear, rotary, etc.) may also be utilized. For example, in various implementations the scale 112 may be a linear absolute position scale that includes a fine track and one or more coarser tracks. Some examples of absolute position encoders with scales utilizing a fine track in combination with two coarser tracks are described in U.S. Pat. Nos. 7,608,813 and 8,309,906, which are commonly assigned and hereby incorporated herein by reference in their entireties.

As noted above, in various implementations, the position encoder system 105 and host motion control system 130 may operate in a request and response format. In prior systems this process has included three steps. First, the host motion control system 130 would send a request for position (e.g., a position trigger signal). In various implementations, the request for position may be issued at a fixed time interval (e.g., according to a known frequency). Once the position request was received, the position encoder system 105 would operate to sample the output of the transducer electronics 116. Finally, the position encoder system 105 would respond by transmitting position information to the host motion control system 130.

In various implementations, the timing between the request for position information and the response may be an important factor. For example, certain newer interfaces may have specifications that require a position encoder to respond to a position request from a host motion control system within a relatively short time frame. As one specific example, a position encoder may be required to respond with position data within 10 microseconds of when a position request is received from a host motion control system. While such response times may, in some instances, be achieved with high speed data converters, such components may be relatively expensive and/or difficult to design into an integrated circuit.

In accordance with techniques disclosed herein, response times may be improved through utilization of a pre-trigger signal process. More specifically, in various implementations, a pre-trigger lead time is determined that is a fraction of a duration of a defined encoder position sample period. A current instance of the encoder position sample period is then initiated by a pre-trigger signal that is provided at the pre-trigger lead time before a next predictable time of a position trigger signal (e.g., as occurring at regular intervals). A current position trigger signal is then received (e.g., near the middle of the current instance of the encoder position sample period) from the host motion control system. The average effective sample time of the current instance of the encoder position sample period coincides with the actual timing of the current position trigger signal within an allowed tolerance window.

It will be appreciated that by utilizing such techniques to start the sampling process before a next position request (e.g., a position trigger signal) is received from a host motion control system, a position output can be produced more quickly relative to when the position request is received. In various implementations, an additional benefit of such techniques is that a centroid of the position sample may more closely coincide with the actual timing of the position request. In one specific implementation, the numerical position computed from the sample may, during constant speed operation, approximately match the actual encoder position at the time of the sample centroid. As a result, the numerical position that is returned from the request may at least approximately coincide with the timing of the position request.

Figure 2:
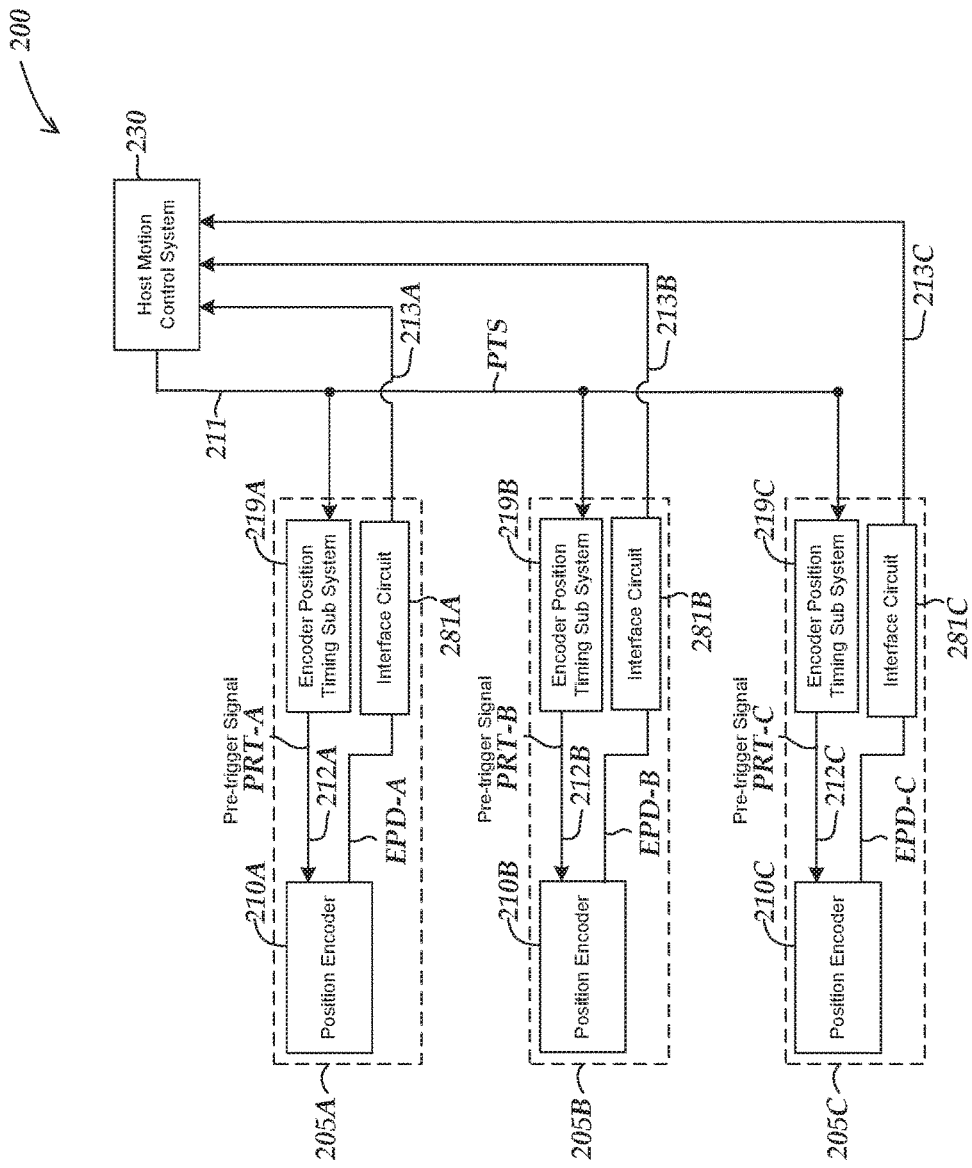
FIG. 2 is a block diagram of multiple position encoder systems as coupled to a host motion control system.

FIG. 2 is a block diagram emphasizing certain aspects of a positioning system 200 including three position encoder systems 205A-205C that are coupled to a host motion control system 230. Similar references numbers 2XX in FIGS. 2 and 1XX in FIG. 1, may refer to similar elements unless otherwise indicated by context or description. Each of the position encoder systems 205A-205C includes a respective position encoder 210A-210C, a respective encoder position timing subsystem 219A-219C and a respective interface circuit 281A-281C (e.g., as may be included in the interface electronics of position encoder systems 205A-205C, described above with reference to FIG. 1). As illustrated, each of the respective encoder position timing subsystems 219A-219C is coupled between a respective position encoder 210A-210C and the host motion control system 230. In various alternative implementations, each of the encoder position timing subsystems 219A-219C may be included in the respective position encoders 210A-210C (e.g., within readhead electronics of the position encoders, as previously outlined in the description related to FIG. 1).

In operation, each of the encoder position timing subsystems 219A-219C receives position trigger signals from the host motion control system 230. As will be described in more detail below, the encoder position timing subsystems 219A-219C may determine and utilize a pre-trigger lead time for each of the position encoders 210A-210C. More specifically, for each of the position encoders 210A-210C, the respective encoder position timing subsystem 219A-219C may operate to provide a pre-trigger signal to initiate a current instance of the respective encoder position sample period at the pre-trigger lead time before a next predictable time of the position trigger signal from the host motion control system 230. In various implementations, the position encoders 210A-210C may each have the same or different encoder position sample periods, for which the pre-trigger lead times that are determined by the encoder position timing subsystems 219A-219C may also be different. For example, if the position encoder 210A has a defined encoder position sample period that is longer than a defined encoder position sample period of the position encoder 210B, the associated pre-trigger lead time that is determined and utilized by the encoder position timing subsystem 219A may be longer than the pre-trigger lead time that is determined and utilized by the encoder position timing subsystem 219B.

In operation, the host motion control system 230 outputs position trigger signals PTS on a signal line 211 which is coupled as an input to each of the respective encoder position timing subsystems 219A-219C. As described above, each of the encoder position timing subsystems 219A-219C outputs at a determined pre-trigger lead time a respective pre-trigger signal PRT-A to PRT-C on respective signal lines 212A-212C to the respective position encoders 210A-210C. As described above, the position encoder timing subsystems 219A-219C are operated to output the pre-trigger signals PRT-A to PRT-C and thus initiate the current instances of the encoder position sample periods at the respective pre-trigger lead times before a next predictable time of a position trigger signal PTS from the host motion control system 230. As will be described in more detail below with respect to FIG. 4, after the position sampling has been completed by the respective position encoder 210A-210C (e.g., the position sampling for a fine scale track), the respective encoder position data EPD-A to EPD-C is output to interface circuits 281A-281C (e.g., serial interface circuits), which provides corresponding position data formatted on respective signal lines 213A-213C that are coupled to the host motion control system 230.

In various implementations, each of the position encoders 210A-210C may be utilized to determine a position along a different axis of movement (e.g., along x, y and z axes of movement) of the positioning system 200. In one specific example implementation, the position encoder 210A may be utilized for determining a position along an x-axis, while the position encoder 210B may be utilized for determining a position along a y-axis and the position encoder 210C may be utilized for a determining position along a z-axis. In other implementations, one or more of the position encoders may be utilized for determining other types of position data (e.g., rotary, movement of components in different physical locations of the positioning system 200, etc.).

Figure 3:
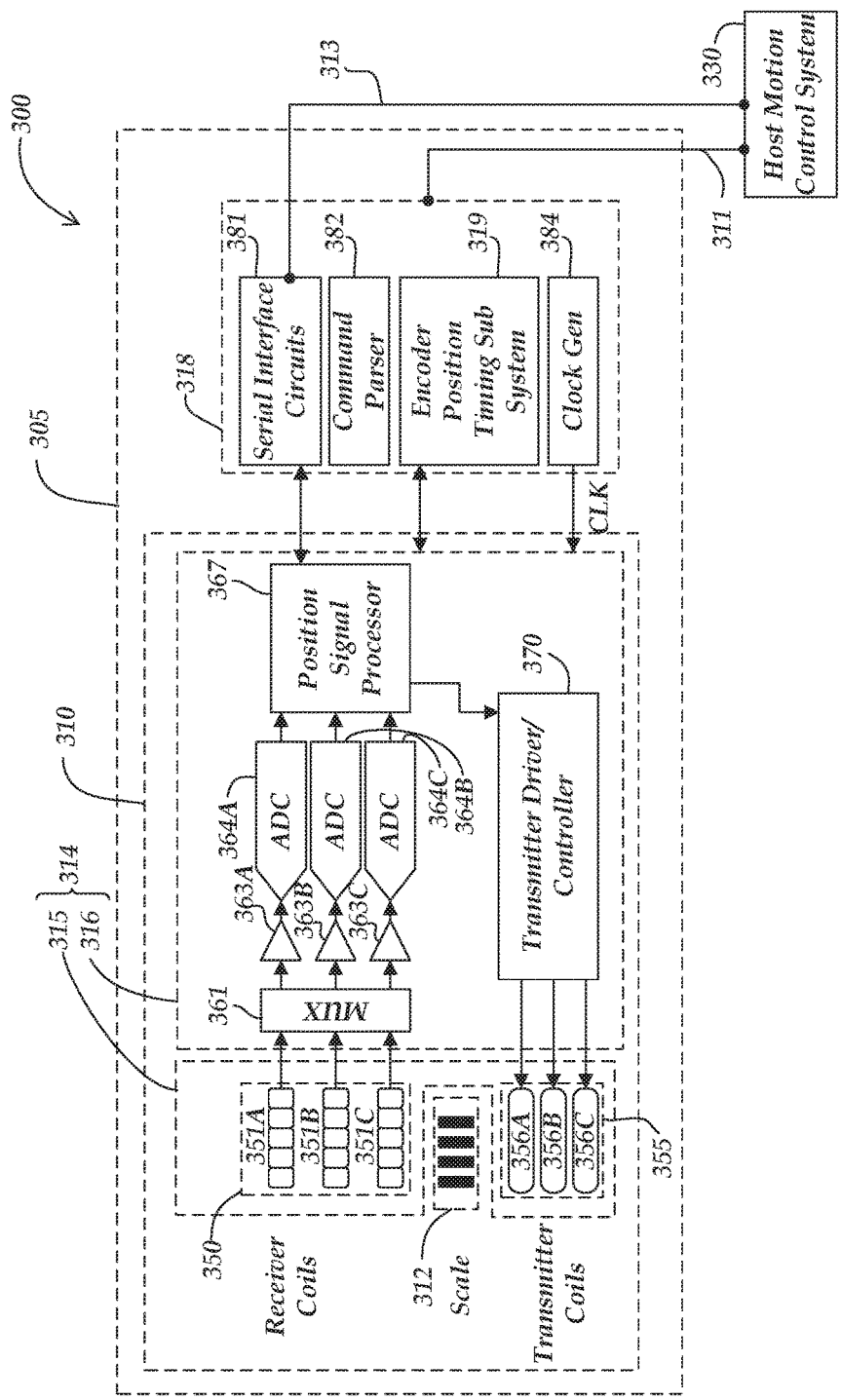
FIG. 3 is a block diagram of a readhead and interface electronics of a position encoder.

FIG. 3 is a block diagram 300 showing certain aspects of a position encoder system 305. In particular, certain details are shown for one embodiment of a readhead 314 of a position encoder 310, and interface electronics 318. Similar references numbers 3XX in FIG. 3, 2XX in FIGS. 2 and 1XX in FIG. 1, may refer to similar elements or functions, and may be understood by analogy unless otherwise indicated by context or description. In some implementations, the interface electronics 318 may be included in the readhead 314 (e.g., on a single printed circuit board). The readhead 314 includes a transducer element 315 and transducer electronics 316. As noted above, in various implementations, the transducer may be an inductive transducer, which is illustrated schematically in FIG. 3. The transducer element 315 includes a receiver coils portion 350 and a transmitter coils portion 355. The receiver coils portion 350 includes receiver coils 351A, 351B and 351C, and the transmitter coils portion 355 includes transmitter coils 356A, 356B and 356C. In operation, the coupling between the transmitter coils and the receiver coils is "position modulated" by the scale 312, which is configured such that the coupling modulation depends on the relative position between the scale 312 and the transducer element 315, according to known methods. The transducer electronics 316 inputs position modulated signals sensed by the receiver coil portions 350.

In the illustrated embodiment, the transducer electronics 316 includes a multiplexer 361, amplifiers 363A-363C, analog-to-digital converters 364A-364C, a position signal processor 367, and a transmitter driver/controller 370. The outputs of the receiver coils 351A-351C are coupled through the multiplexer 361 to the amplifiers 363A-363C, respectively. The outputs of the amplifiers 363A-363C are coupled to the analog-to-digital converters 364A-364C, respectively. The outputs of the analog-to-digital converters 364A-364C are coupled to the position signal processor 367. The outlined components may operate according to known principles (e.g., as disclosed in the incorporated references) and/or as disclosed further below with respect to FIGS. 4 and 5, to determine the absolute position of the position encoder according to the signals from the receiver coils 351A-351C.

In the illustrated implementation, the interface electronics 318 may include serial interface circuits 381 (e.g., comprising an RS-485 interface), a command parser 382, an encoder position timing subsystem 319, and a clock generator 384. The interface electronics 318 may further include various other components not shown (e.g., power supply components, regulators, etc.) as desired or necessary, according to known principles. The serial interface circuits 381 may receive the output from the position signal processor 367 and provide encoder position data formatted for outputting to a host motion control system 330 on a signal line(s) 313. Power and/or other signals may be provided between the host motion control system 330 and the position encoder system 305 on line(s) 311. The clock generator 384 may provide a clock signal to the transducer electronics 316. In various implementations, various components and/or functions of the interface electronics 318 may be provided in a field programmable gate array, if desired.

Figure 4:
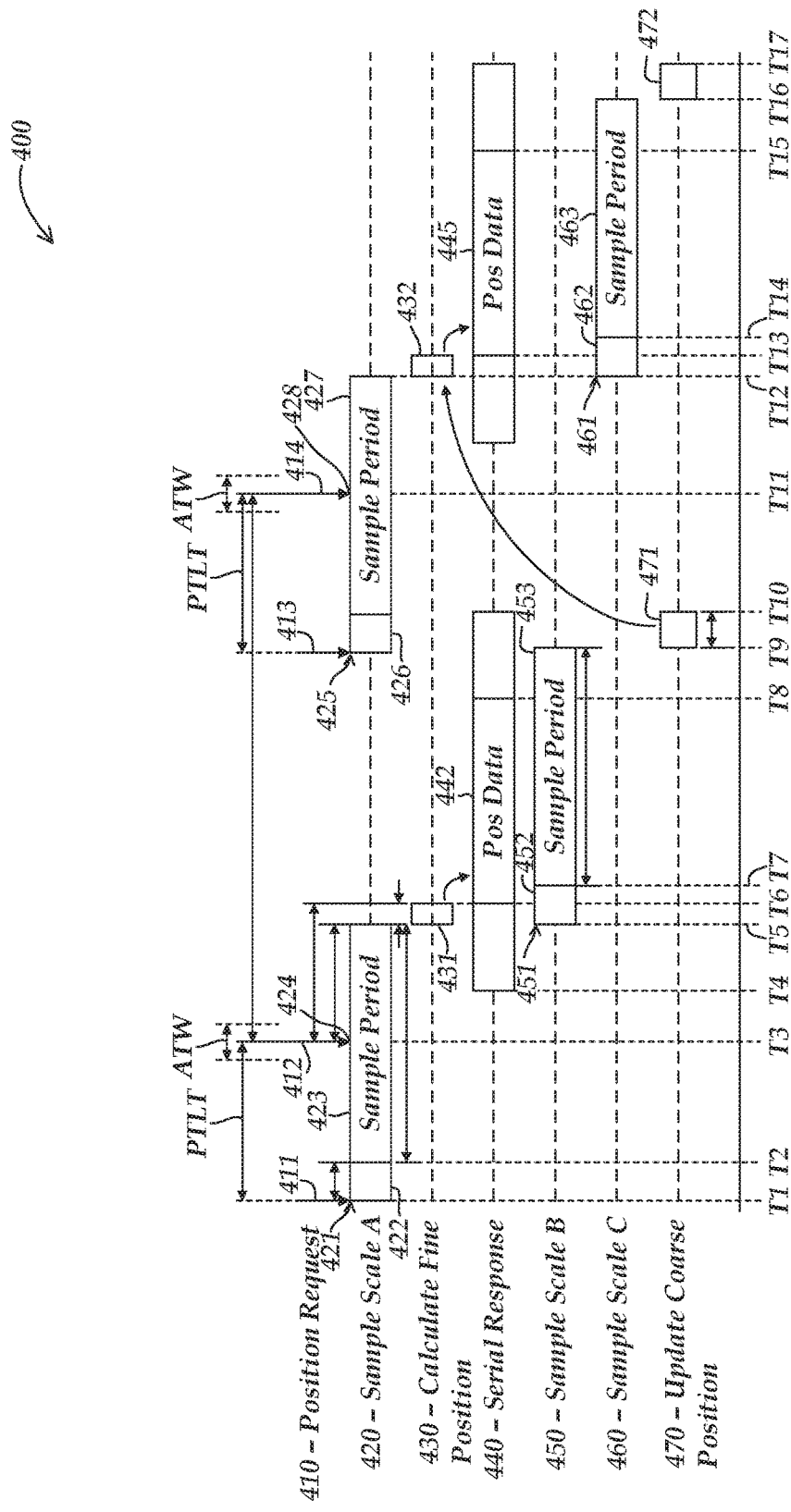
FIG. 4 is a timing diagram illustrating signals in a position encoder system in accordance with a first exemplary implementation.

FIG. 4 is a timing diagram 400 illustrating timelines 410-470 for various signals in a position encoder system in accordance with a first exemplary implementation. As shown in FIG. 4, a position request timeline 410 illustrates position trigger signals 412 and 414 (e.g., as received from a host motion control system), and corresponding pre-trigger signals 411 and 413 (e.g., as generated by an encoder position timing subsystem), as will be described in more detail below. A sample scale A timeline 420 illustrates encoder position sample periods 421 and 425, while a sample scale B timeline 450 illustrates an encoder position sample period 451 and a sample scale C timeline 460 illustrates an encoder position sample period 461. As will be described in more detail below, each of the encoder position sample periods 421, 425, 451 and 461 correspond to a sampling of a respective scale track A, B or C (e.g., of the scale 112 of FIG. 1), wherein the scale track A corresponds to a fine scale track, and the scale tracks B and C correspond to coarser scale tracks.

A calculate fine position timeline 430 illustrates a fine position calculation period 431, and an update coarse position timeline 470 illustrates coarse position update periods 471 and 472. As will be described in more detail below, the calculating and updating of the respective positions is performed after the end of each of the respective encoder position sampling periods 421, 451, 425 and 461. A serial response timeline 440 illustrates data transmission periods 442 and 445. As will be described in more detail below, each of the data transmission periods 442 and 445 correspond to the position encoder outputting a current instance of the encoder position data (e.g., as calculated and updated, etc.) to the host motion control system at a timing that is associated with a corresponding current position trigger signal 412 or 414 that was previously received from the host motion control system as part of a position request. More specific details regarding the operations of the position encoder system during each of the timelines 410-470 will be described in more detail below.

As illustrated in the position request timeline 410, at a time T1, the pre-trigger signal 411 is generated (e.g., as provided by an encoder position timing subsystem) and at a time T3, the current position trigger signal 412 is received (e.g., from the host motion control system). As illustrated in the sample scale A timeline 420, the pre-trigger signal 411 initiates the current instance of the encoder position sample period 421, which begins at the time T1 and ends at a time T5. In the example of FIG. 4, the encoder position sample period 421 corresponds to a sampling of a scale track A (e.g., a fine scale track of the scale 112 of FIG. 1). The current instance of the encoder position sample period 421 includes a transmitter setup period 422 from the time T1 to a time T2 (e.g., for charging up the transmitter coils 356A-356C of the transducer element 315 of FIG. 3), and an effective sample period 423 from the time T2 to the time T5. The effective sample period 423 has an average effective sample time 424 that corresponds to a time T3, which coincides with the actual timing of a current position trigger signal 412 within an allowed tolerance window ATW. In the particular example of FIG. 4, the average effective sample time 424 and the actual timing of the current position trigger signal 412 both approximately occur at the time T3. More specifically, a pre-trigger lead time PTLT may be timed for the initiation of the current instance of the encoder position sample period 421 such that the average effective sample time 424 of the current instance of the encoder position sample period 421 is approximately the same as the actual timing of the current position trigger signal 412 at the time T3.

As illustrated, the pre-trigger signal 411 is generated at the time T1 which occurs at the pre-trigger lead time PTLT before the actual timing of the current position trigger signal 412 that occurs at the time T3. As described above, the pre-trigger lead time PTLT is determined (e.g., by the encoder position timing subsystem) and is a fraction of the duration of the defined encoder position sample period 421 during which the position encoder performs operations to acquire encoder position data associated with a current encoder position (e.g., the position of the transducer element 115 relative to the scale 112 of FIG. 1). In one implementation, the pre-trigger lead time PTLT is approximately equal to one-half of the effective sample period 423 plus the transmitter setup period 422 of the encoder position sample period 421.

As illustrated in the calculate fine position timeline 430, after the encoder position sample period 421 ends, the fine position calculation period 431 begins at the time T5 and ends at a time T6. In various implementations, the fine position calculation period 431 corresponds to a calculation of a fine position (e.g., in accordance with a position of the transducer element 115 relative to a fine scale track of the scale 112 of FIG. 1). As illustrated in the serial response timeline 440, after the fine position calculation period 431 ends, the data transmission period 442 begins at the time T6 and ends at a time T8. During the data transmission period 442, the position encoder is operated to output the current instance of the encoder position data at a time associated with the current position trigger signal 412, such that the host motion control system associates the current instance of the encoder position data with the current position trigger signal 412. As will be described in more detail below, while the position data is being transmitted, the position encoder may be further operated to sample one of the coarser scale tracks of the scale 112 (e.g., scale track B or C), for which the position data from the coarser scale track is used to update the coarser portion of the absolute position in the following sample period. The sampling of the scale track B or C may be alternated for subsequent sample periods, as will be described in more detail below.

As illustrated in the sample scale B timeline 450, the encoder position sample period 451 begins at the time T5 and ends at a time T9. Similar to the encoder sample period 421, the encoder position sample period 451 includes a transmitter setup period 452 from the time T5 to a time T7, and an effective sample period 453 from the time T7 to a time T9. The encoder position sample period 451 corresponds to a sampling of a coarser scale track B (e.g., of the scale 112 of FIG. 1). As illustrated in the update coarse position timeline 470, after the encoder position sample period 451 ends, the coarse position update period 471 begins at the time T9 and ends at a time T10. In various implementations, the coarse position update period 471 corresponds to a calculation and update of a coarse position, in accordance with the sampling of the scale track B in the preceding encoder position sample period 451. As will be described in more detail below, the updated coarse position data is subsequently combined with fine position data from a subsequent fine position calculation period 432, to determine an absolute position (e.g., of the transducer element 115 relative to the scale 112 of FIG. 1).

As illustrated in the sample scale A timeline 420, the encoder position sample period 425 begins at the time T9 and ends at a time T12. Similar to the encoder position sample period 421, the encoder position sample period 425 includes a transmitter setup period 426 from the time T9 to a time T10, and an effective sample period 427 from the time T10 to a time T12. The effective sample period 427 has an average effective sample time 428 that corresponds to a time T11, which coincides with the actual timing of the current position trigger signal 414 within an allowed tolerance window ATW.

As illustrated in the calculate fine position timeline 430, the fine position calculation period 432 begins at the time T12 and ends at the time T13, which, similar to the fine position calculation period 431, corresponds to a calculation of a fine position (e.g., in accordance with a position of the transducer element 115 relative to a fine scale track of the scale 112 of FIG. 1). As noted above, the updated coarse position data from the coarse position update period 471 is combined with the calculated fine position data from the fine position calculation period 432 in order to update the overall absolute position (e.g., of the transducer element 115 relative to the scale 112 of FIG. 1).

As illustrated in the serial response timeline 440, a data transmission period 445 begins at the time T13 and ends at a time T15. Similar to the data transmission period 442, the data transmission period 445 corresponds to operating the position encoder to output the current instance of the encoder position data (e.g., as calculated during the position calculation period 432) at a time associated with the current position trigger signal 414, such that the host motion control system associates the current instance of the encoder position data with the current position trigger signal 414. As illustrated in the sample scale C timeline 460, the encoder position sample period 461 begins at the time T12 and ends at the time T16. Similar to the encoder position sample period 421, the encoder position sample period 461 includes a transmitter setup period 462 from the time T12 to a time T14, and an effective sample period 463 from the time T14 to a time T16. The encoder position sample period 461 corresponds to a sampling of the coarser scale track C (e.g., of the scale 112 of FIG. 1).

It will be appreciated that the sequence of FIG. 4 illustrates how the coarser scale tracks B and C (e.g., of an absolute encoder embodiment of the scale 112 of FIG. 1) are sampled in an alternating manner, as is performed during the data transmission periods 442 and 445 while the position data is being transmitted to the host motion control system. As illustrated in the update coarse position timeline 470, the coarse position update period 472 begins at a time T16 and ends at a time T17 (e.g., corresponding to the calculation of the coarse position according to the sampling of the scale track C during the encoder position sample period 461). Similar to the coarse position update period 471, the coarse position data determined during the coarse position update period 472 is utilized to update the coarser portion of the absolute position in the next position calculation period.

It will be appreciated that the process described above with respect to FIG. 4 illustrates how a pre-trigger signal may be utilized to reduce the overall response time that occurs between when a position trigger signal is sent from a host motion control system and when, in response, the transmission of position data back to the host motion control system begins. Most generally, the disclosed pre-trigger principles may be used for the sampling and position data determination of any one scale, or all scales of a position encoder, in various embodiments. As some specific timing examples, if a system has a requirement that the response time (e.g., for the start of the transmission data) be within a required response time (e.g., within 10 microseconds of the receipt of the position trigger signal), and if the overall encoder position sample period (e.g., 16 microseconds) plus the position calculation period (e.g., 1 microsecond) takes longer than the required response time, it will be appreciated that if the sampling was not started until after the position trigger signal was received, the system would not be able to start transmitting the position data within the required response time. In contrast, by utilizing the techniques disclosed herein, including the utilization of the pre-trigger signal to start the encoder position sample period before the position trigger signal is received from the host motion control system, the resulting overall response time for the start of the transmission of the position data (e.g., 8 microseconds) may be less than the required response time (e.g., 10 microseconds).

Figure 5:
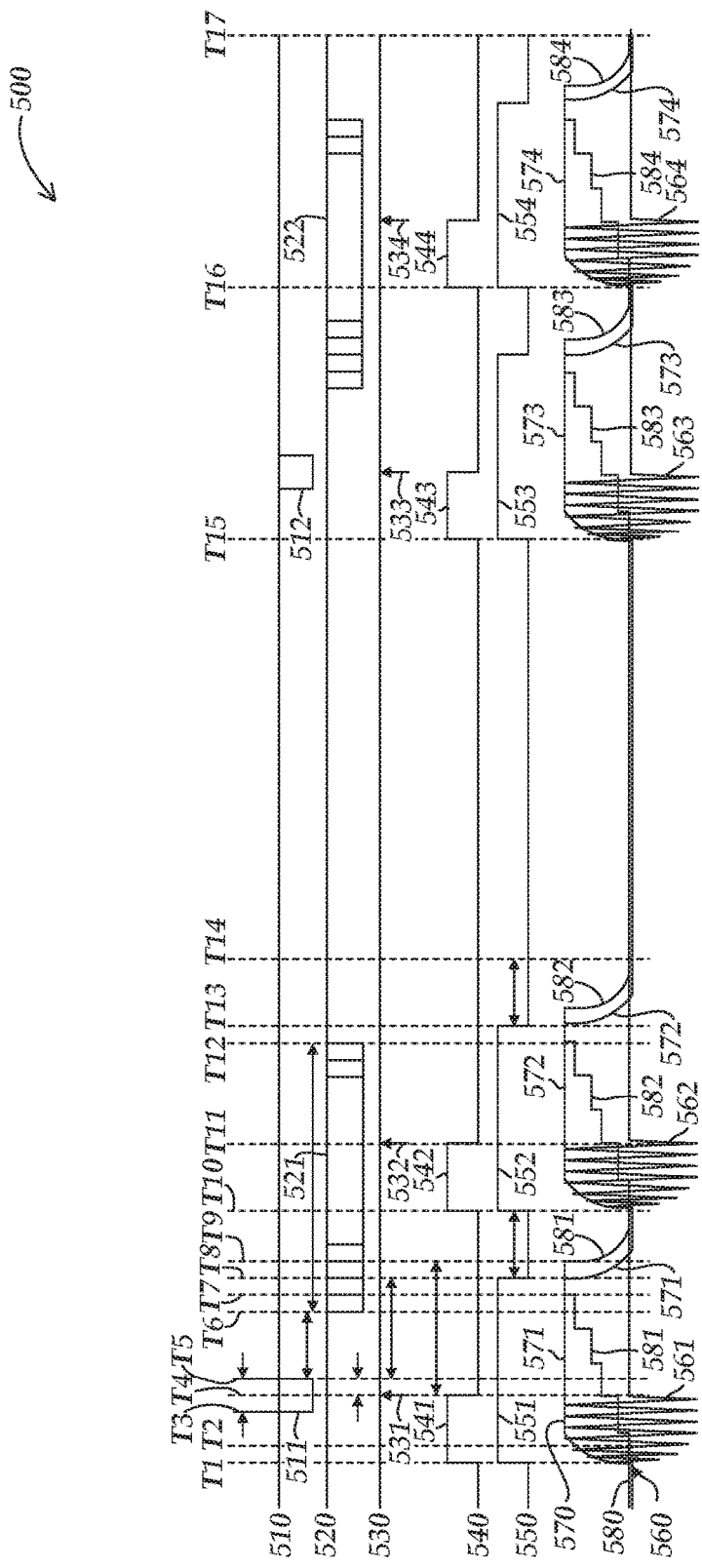
FIG. 5 is a timing diagram illustrating signals in a position encoder system in accordance with a second exemplary implementation.

FIG. 5 is a timing diagram 500 illustrating timelines 510-530 and signals 540-580 in a position encoder system in accordance with a second exemplary implementation. As shown in FIG. 5, an NC request timeline 510 illustrates position request periods 511 and 512 (e.g., including position trigger signals received from a host motion control system). An NC response timeline 520 illustrates data transmission periods 521 and 522. As will be described in more detail below, each of the data transmission periods 521 and 522 correspond to the position encoder outputting a current instance of the encoder position data (e.g., as calculated, updated, etc.) at a time that is associated with a corresponding current position trigger signal that was previously received from the host motion control system. A scale sample timeline 530 illustrates sample scale markers 531-534, which correspond to respective scale sampling (e.g., of scale tracks A, B, or C).

An enable driver signal 540 includes signal portions 541-544 (e.g., for driving the transmitter coils 356A-356C of the transducer element 315 of FIG. 3). An enable analog-to-digital converter (ADC) signal 550 includes signal portions 551-554 (e.g., for enabling the ADC's 364A-364C of the transducer electronic 316 of FIG. 3). A drive waveform signal 560 includes signal portions 561-564 (e.g., corresponding to the schematically illustrated oscillating drive waveform for driving the transmitter coils 356A-356C of the inductive transducer element 315 of FIG. 3). The sample and hold filtered signal 570 includes signal portions 571-574 (e.g., corresponding to sample and hold values of the receiver coils 351A-351C of the transducer element 315 of FIG. 3). The ADC filtered output signal 580 includes schematically represented ADC signal conversion portions 581-584 (e.g., corresponding to the ADC values of the encoder position data as sampled from the respective scale tracks A, B or C). More specific details regarding the timing of the various signals illustrated in FIG. 5 will be described in more detail below.

As illustrated in FIG. 5, at a time T1 (e.g., corresponding to a "predictive start scale A" timing), a pre-trigger signal is generated (e.g., as provided by an encoder position timing subsystem), which initiates a sampling of a fine scale track A (e.g., similar to the encoder position sample period 421 of FIG. 4 for sampling the fine scale track A). Correspondingly, the enable driver signal 540 and the enable ADC signal 550 both transition from low to high at the time T1. In response, the drive waveform signal 560 begins oscillating and the sample and hold filtered signal 570 begins transitioning to a higher state approximately corresponding to the peaks of the drive waveform signal 560, and the ADC filtered output signal 580 begins a period of stepped transitions.

At a time T2 (e.g., corresponding to a "driver start-up" timing) the peaks of the oscillating drive waveform signal 560 are shown to approximately reach a maximum state. At a time T3 (e.g., corresponding to a "start request" timing), a position request period 511 begins as illustrated in the NC request timeline 510, as may correspond to the receipt of a position trigger signal from the host motion control system. At a time T4 (e.g., corresponding to a "sample scale A" timing), a sample scale marker 531 is indicated as shown in the scale sample timeline 530. At the time T4, the enable driver signal 540 transitions from high to low, and the drive waveform signal 560 correspondingly ceases to oscillate and returns to a zero level. The signal portion 541 (from the time T1 to the time T4) of the enable driver signal 540 and the corresponding signal portion 561 (from the time T1 to the time T4) of the drive waveform signal 560 are noted to correspond to the sampling of the fine scale track A.

At a time T5 (e.g., corresponding to an "end request" timing), the position request period 511 ends, as illustrated in the NC request timeline 510. At a time T6 (e.g., corresponding to a "start to respond" timing), the data transmission period 521 begins, as illustrated in the NC response timeline 520. At a time T7 (e.g., corresponding to an "ADC ready" timing), the ADC is indicated as being ready (e.g., for the subsequent processes including the sending of the position data). At a time T8 (e.g., corresponding to a "send position data" timing), the process for sending/transmitting the position data begins, the enable ADC signal 550 transitions from high to low, and the sample and hold filtered signal 570 correspondingly begins a transition downward toward a zero level. At a time T9 (e.g., corresponding to an "ADC off/reset" timing), the ADC filtered output signal 580 begins a transition downward toward a zero level. The signal portion 551 (from the time T1 to the time T8) of the enable ADC signal 550, the signal portion 571 (from the time T1 to the time T8) of the sample and hold filtered signal 570 and the signal conversion portion 581 (from the time T1 to the time T9) of the ADC filtered output signal 580 are noted to correspond to the sampling of the fine scale track A.

Starting at a time T10 (e.g., corresponding to a "start scale B" timing), the sampling process repeats for the sampling of the coarser scale track B (e.g., similar to the encoder position sample period 451 of FIG. 4 for sampling scale track B). It is noted that the sampling of the coarser scale track B is performed at least in part while the position data is being transmitted to the host motion control system (i.e., during the data transmission period 521), similar to the process of FIG. 4. At the time T10, the enable driver signal 540 and the enable ADC signal 550 both transition from low to high, and the drive waveform signal 560 correspondingly begins to oscillate, the sample and hold filtered signal 570 begins transitioning to a higher state (i.e., approximately following the peaks of the drive waveform signal 560) and the ADC filtered output signal 580 begins a period of stepped transitions, all as corresponding to the sampling of the coarser scale track B. At a time T11 (e.g., corresponding to a "sample scale B" timing), the enable driver signal 540 transitions from high to low, and the drive waveform signal 560 correspondingly ceases to oscillate and returns to a zero level. The signal portion 542 (from the time T10 to the time T11) of the enable driver signal 540 and the signal portion 562 (from the time T10 to the time T11) of the drive waveform signal 560 are noted to correspond to the sampling of the coarser scale track B.

At a time T12 (e.g., corresponding to a "transmission complete" timing), the data transmission period 521 ends, as illustrated in the NC response timeline 520. At a time T13 (e.g., corresponding to an "A+B/C scale finished" timing), the enable ADC signal 550 transitions from high to low, and the sample and hold filtered signal 570 correspondingly begins transitioning downward toward a zero level, followed by the ADC filtered output signal 580 transitioning downward toward a zero level. The signal portion 552 (from time T10 to time T13) of the enable ADC signal 550, the signal portion 572 (from the time T10 to the time T13) of the sample and hold filtered signal 570, and the signal portion 582 (from the time T10 to the time T13) of the ADC filtered output signal 580, are noted to correspond to the sampling of the coarser scale track B. At a time T14 (e.g., corresponding to a "reset complete" timing), the sample and hold filtered signal 570 and the ADC filtered output signal 580 have completed transitioning to a zero level, for which the reset process is complete.

Following the time T14, the process repeats for another sampling of the fine scale track A and for a sampling of the coarser scale track C (i.e., similar to the process in the second half of FIG. 4). More specifically, a second pre-trigger signal is generated (e.g., by the encoder position timing subsystem) at a time T15 (e.g., corresponding to a "predictive start scale A" timing, similar to the time T1), which starts the process for sampling the fine scale track A. Similar to the signals described above between the times T1 and T10, the signal portions corresponding to the sampling of the fine scale track A include the signal portion 543 of the enable driver signal 540, the corresponding signal portion 563 of the drive waveform signal 560, the signal portion 553 of the enable ADC signal 550, and the corresponding signal portions 573 and 583 of the sample and hold filtered signal 570 and the ADC filtered output signal 580, respectively. During the sampling of the fine scale track A, a position request period 512 occurs (e.g., including a position trigger signal received from the host motion control system), and a corresponding sample scale marker 533 occurs in the scale sample timeline 530. At the end of the sampling of the fine scale track A, a data transmission period 522 occurs as illustrated in the NC response timeline 520 (e.g., for transmitting to the host motion control system the position data corresponding to the sampling of the fine scale track A, as well as the updated coarse position data as determined from the previous sampling of the coarser scale track B during the times T10-T14).

While the data transmission period 522 is in process, a sampling of the coarser scale track C begins at a time T16 (e.g., corresponding to a "start scale C" timing, similar to the process at the time T10 except with respect to the scale track C rather than the scale track B). Similar to the signals described above between the times T10 and T14 for the sampling of the coarser scale track B, the signal portions corresponding to the sampling of the coarser scale track C include the signal portion 544 of the enable driver signal 540, the corresponding signal portion 564 of the drive waveform signal 560, the corresponding sample scale marker 534 in the scale sample timeline 530, the signal portion 554 of the enable ADC signal 550, and the corresponding signal portions 574 and 584 of the sample and hold filtered signal 570 and the ADC filtered output signal 580, respectively. At a time T17 (e.g., corresponding to a "reset complete" timing, similar to the process at the time T14), the sample and hold filtered signal 570 and the ADC filtered output signal 580 have completed transitioning to a zero level, for which the reset process is complete. Similar to the sampling of the coarser scale track B, the position data determined during the sampling of the coarser scale track C between the times T16 and T17 is utilized to update the coarser position portion of the absolute position in a following sequence of the sampling process (e.g., similar to the utilization of the coarse position data from the coarse position update period 471 in combination with the fine position data from the subsequent position calculation period 432 to determine the current overall absolute position data that is transmitted as part of the data transmission period 445 of FIG. 4).

Figure 6:
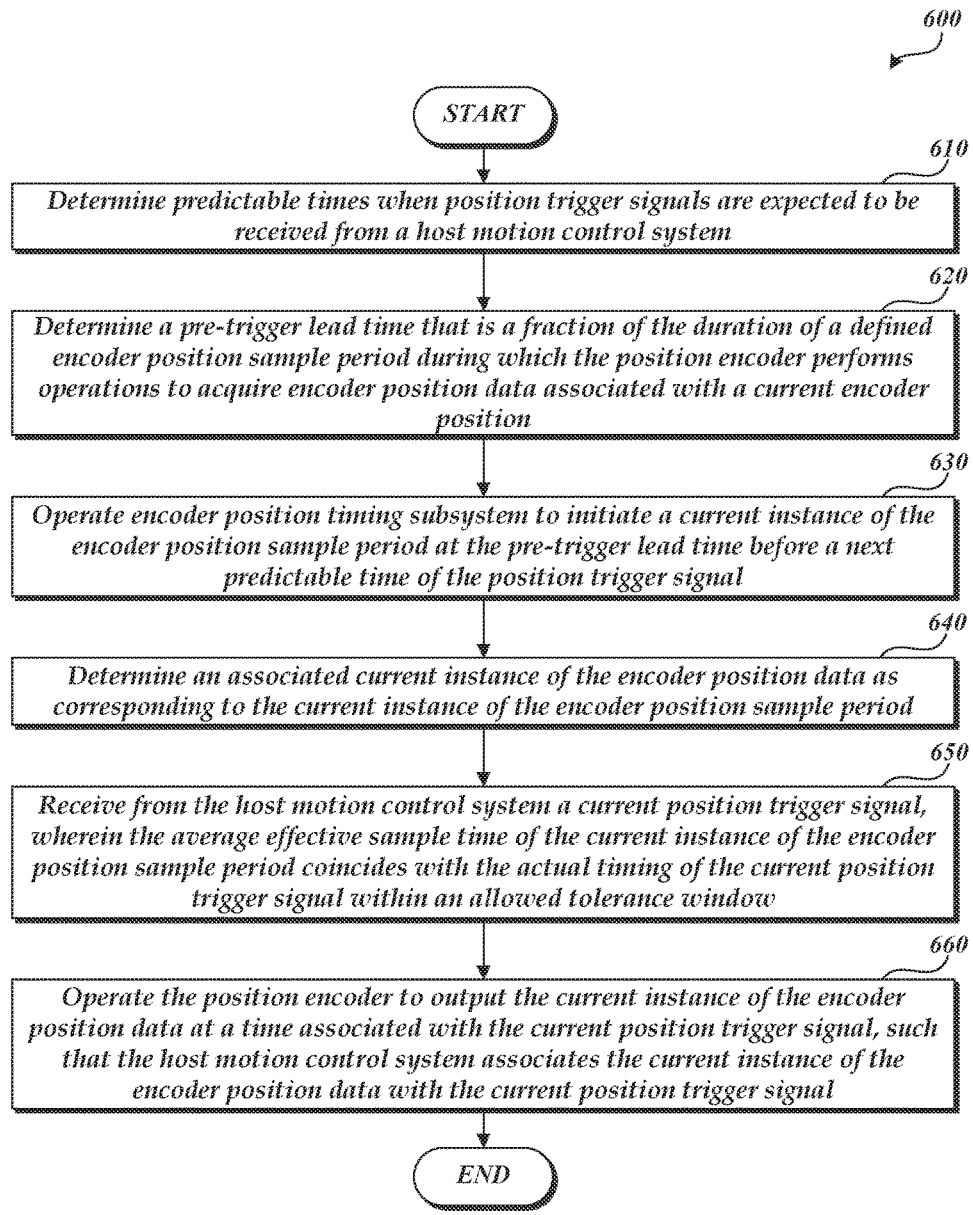
FIG. 6 is a flow diagram illustrating one exemplary implementation of a routine for operating a position encoder system.

FIG. 6 is a flow diagram illustrating one exemplary implementation of a routine 600 for operating a position encoder system including a position encoder that is configured to be utilized for outputting encoder position data corresponding to encoder positions and an encoder position timing subsystem. As shown in FIG. 6, at a block 610, predictable times are determined when position trigger signals are expected to be received from a host motion control system. In various implementations, the position trigger signals from a host motion control system may occur at predetermined time intervals (e.g., according to a known frequency). If such a predetermined time interval is known, the timing for subsequent position trigger signals may correspondingly be determined once a first position trigger signal is received (i.e., wherein the timing of the first position trigger signal is utilized as a basis for estimating the timing of the subsequent position trigger signals according to the known predetermined time interval between the position trigger signals).

Alternatively, in such configurations if the predetermined time interval is not initially known, it can be measured. For example, the determining of the predictable times when the position trigger signals are expected to be received from the host motion control system may include inputting at least two consecutive position trigger signals to the encoder position timing subsystem, and determining a corresponding timing of the position trigger signals as indicated by a time difference between the at least two consecutive position trigger signals. As another example, if the repeated position trigger signals are received from the host motion control system at a defined trigger frequency, the determining of the predictable times may include inputting the repeated position trigger signals to the encoder position timing subsystem at the trigger frequency and determining a timing of the repeated position trigger signals. In such a configuration, the operating of the encoder position timing subsystem to initiate a current instance of the encoder position sample period at the pre-trigger lead time before the next predictable time of the position trigger signal may include initiating the current instance of the encoder position sample period at a time that corresponds to the pre-trigger lead time before the next predictable time of the position trigger signal. In various implementations, the process for determining the predictable times may be repeated at later times (e.g., the measuring of the time differences between position trigger signals may be an ongoing process), so that any changes in the timing may be detected and so that the sample timing may be corrected and/or otherwise adjusted on an ongoing basis.

At a block 620, a pre-trigger lead time is determined that is a fraction of the duration of a defined encoder position sample period during which the position encoder performs operations to acquire encoder position data associated with a current encoder position. At a block 630, the encoder position timing subsystem is operated to initiate a current instance of the encoder position sample period at the pre-trigger lead time before a next predictable time of the position trigger signal. As previously described with respect to FIGS. 4 and 5, in various implementations, the encoder position sample period may correspond to a sampling of at least one fine track, wherein after the at least one fine track is sampled during the current instance of the encoder sample period, a second encoder sample period may be initiated at a later time for sampling the at least one coarse track before the next position trigger signal is received from the host motion control system.

At a block 640, an associated current instance of the encoder position data is determined as corresponding to the current instance of the encoder position sample period. At a block 650, a current position trigger signal is received from the host motion control system, wherein the average effective sample time of the current instance of the encoder position sample period coincides with the actual timing of the current position trigger signal within an allowed tolerance window. At a block 660, the position encoder is operated to output the current instance of the encoder position data at a time associated with the current position trigger signal, such that the host motion control system associates the current instance of the encoder position data with the current position trigger signal.

In various implementations, if the average effective sample time of the current instance of the encoder position sample period is determined to not coincide with the actual timing of the current position trigger signal within an allowed tolerance window, various corrective actions may be taken. For example, if the frequency of the position trigger signals has not changed (e.g., as determined by measuring the timing between position trigger signals), the timing of when the future position trigger signals are expected to be received may be shifted according to utilizing the timing of a most recently received position trigger signal as a basis for estimating when future position trigger signals will be received according to the known frequency. If the frequency of the position trigger signals is determined to have changed, the newly determined frequency may be utilized for estimating when future position trigger signals will be received. In some instances, a warning or other notification may be provided to a user with respect to position trigger signals that are not being received at expected times (e.g., so that corrective action can be taken, etc.).

With respect to an instance in which a position trigger signal is not received by a time when an encoder position sample period is complete, various additional corrective actions may be taken. For example, with respect to a position calculation period and a position data transmission period that follow an encoder position sample period, such processes may be cancelled and/or otherwise modified based on a position trigger signal not having been received within an expected timeframe. More specifically, if a position trigger signal is not received by the time an encoder position sample period is complete, the processes for transmitting position data (e.g., as would otherwise be done in response to the receipt of a position trigger signal) may be cancelled, delayed, or otherwise modified.

While preferred implementations of the present disclosure have been illustrated and described, numerous variations in the illustrated and described arrangements of features and sequences of operations will be apparent to one skilled in the art based on this disclosure. Various alternative forms may be used to implement the principles disclosed herein. In addition, the various implementations described above can be combined to provide further implementations. All of the U.S. patents and U.S. patent applications referred to in this specification are incorporated herein by reference, in their entirety. Aspects of the implementations can be modified, if necessary to employ concepts of the various patents and applications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled.

What is claimed is:

1. A method for operating a position encoder system including a position encoder that is configured to be utilized for outputting encoder position data corresponding to encoder positions and an encoder position timing subsystem, wherein the position encoder system receives position trigger signals from a host motion control system, the method comprising:
  determining predictable times when position trigger signals are expected to be received from the host motion control system;
  determining a pre-trigger lead time that is a fraction of the duration of a defined encoder position sample period during which the position encoder performs operations to acquire encoder position data associated with a current encoder position;
  operating the encoder position timing subsystem to initiate a current instance of the encoder position sample period at the pre-trigger lead time before a next predictable time of the position trigger signal;
  determining an associated current instance of the encoder position data as corresponding to the current instance of the encoder position sample period;
  receiving from the host motion control system a current position trigger signal, wherein an average effective sample time of the current instance of the encoder position sample period coincides with the actual timing of the current position trigger signal within an allowed tolerance window; and
  operating the position encoder to output the current instance of the encoder position data at a time associated with the current position trigger signal, such that the host motion control system associates the current instance of the encoder position data with the current position trigger signal.

2. The method of claim 1, wherein operating the encoder position timing subsystem to determine the pre-trigger lead time comprises determining a pre-trigger lead time that is approximately one half of the current duration of an effective sample period plus a transmitter setup period of the encoder position sample period.

3. The method of claim 1, wherein determining the predictable times when the position trigger signals are expected to be received from the host motion control system comprises inputting at least two consecutive position trigger signals to the encoder position timing subsystem, and determining a corresponding timing of the position trigger signals as indicated by a time difference between the at least two consecutive position trigger signals.

4. The method of claim 3, further comprising at a later time repeating the process for determining the predictable times in order to determine if the timing of the position trigger signals has changed.

5. The method of claim 1, wherein repeated position trigger signals are received from the host motion control system at a trigger frequency, and determining the predictable times comprises inputting the repeated position trigger signals to the encoder position timing subsystem at the trigger frequency, and determining a timing of the repeated position trigger signals.

6. The method of claim 5, wherein operating the encoder position timing subsystem to initiate a current instance of the encoder position sample period at the pre-trigger lead time before the next predictable time of the position trigger signal comprises initiating the current instance of the encoder position sample period at a time after a previous position trigger signal that corresponds to the pre-trigger lead time before the next predictable time of the position trigger signal.

7. The method of claim 1, wherein the position encoder includes the encoder position timing subsystem.

8. The method of claim 1, wherein the encoder position timing subsystem is coupled between the position encoder and the host motion control system.

9. The method of claim 1, wherein the pre-trigger lead time is timed for the initiation of the current instance of the encoder position sample period such that the average effective sample time of the current instance of the encoder position sample period is approximately the same as the actual timing of the current position trigger signal.

10. The method of claim 1, wherein the position encoder comprises a scale and readhead.

11. The method of claim 10, wherein the scale is a linear scale.

12. The method of claim 10, wherein the scale is an absolute position scale which includes at least one fine track and at least one coarse track.

13. The method of claim 12, wherein the encoder position sample period corresponds to a sampling of the at least one fine track.

14. The method of claim 13, wherein after the at least one fine track is sampled during the current instance of the encoder position sample period, a second encoder sample period is initiated for sampling the at least one coarse track before the next position trigger signal is received from the host motion control system.

15. The method of claim 1, wherein the current position trigger signal is received from the host motion control system at the next predictable time.

16. A position encoder system, comprising:
  a position encoder;
  one or more processors; and
  a memory coupled to the one or more processors and storing program instructions that when executed by the one or more processors cause the one or more processors to at least:
    determine predictable times when position trigger signals are expected to be received from a host motion control system;
    determine a pre-trigger lead time that is a fraction of the duration of a defined encoder position sample period during which the position encoder performs operations to acquire encoder position data associated with a current encoder position;
    initiate a current instance of the encoder position sample period at the pre-trigger lead time before a next predictable time of the position trigger signal;
    determine an associated current instance of the encoder position data as corresponding to the current instance of the encoder position sample period;
    receive from the host motion control system a current position trigger signal, wherein an average effective sample time of the current instance of the encoder position sample period coincides with the actual timing of the current position trigger signal within an allowed tolerance window; and
    output the current instance of the encoder position data at a time associated with the current position trigger signal.

17. The position encoder system of claim 16, wherein determining the predictable times when the position trigger signals are expected to be received from the host motion control system comprises inputting at least two consecutive position trigger signals and determining a corresponding timing of the position trigger signals as indicated by a time difference between the at least two consecutive position trigger signals.

18. The position encoder system of claim 16, wherein the position encoder includes an encoder position timing subsystem.

19. A position encoder, comprising:
  a scale;
  a readhead configured to provide encoder position data associated with a current encoder position as corresponding to a position of the readhead relative to the scale;
  one or more processors; and
  a memory coupled to the one or more processors and storing program instructions that when executed by the one or more processors cause the one or more processors to at least:
    determine predictable times when position trigger signals are expected to be received from a host motion control system;
    determine a pre-trigger lead time that is a fraction of the duration of a defined encoder position sample period during which the position encoder performs operations to acquire encoder position data associated with a current encoder position as corresponding to a position of the readhead relative to the scale;
    initiate a current instance of the encoder position sample period at the pre-trigger lead time before a next predictable time of the position trigger signal;
    determine an associated current instance of the encoder position data as corresponding to the current instance of the encoder position sample period;
    receive from the host motion control system a current position trigger signal, wherein an average effective sample time of the current instance of the encoder position sample period coincides with the actual timing of the current position trigger signal within an allowed tolerance window; and
    output the current instance of the encoder position data at a time associated with the current position trigger signal.

20. The position encoder of claim 19, wherein the scale is an absolute position linear scale.

* * * * *